United States Patent [19]

Hayashi et al.

[11] 3,798,514

[45] Mar. 19, 1974

[54] HIGH FREQUENCY INSULATED GATE FIELD EFFECT TRANSISTOR WITH PROTECTIVE DIODES

[75] Inventors: Yutaka Hayashi; Yasuo Tarui, both of Tokyo, Japan

[73] Assignee: Kogyo Gijutsuin, Japan

[22] Filed: Oct. 16, 1972

[21] Appl. No.: 298,005

Related U.S. Application Data

[63] Continuation-in-part of Ser. No. 24,167, March 31, 1970, abandoned.

[30] Foreign Application Priority Data

Nov. 20, 1969 Japan ............................ 44/92514

[52] U.S. Cl. ..... 317/235 R, 317/235 B, 317/235 D, 317/235 G, 307/317

[51] Int. Cl. ........................ H01l 11/00, H01l 15/00

[58] Field of Search ........... 317/235, 21.1, 22, 22.2, 317/31; 307/317 A

[56] References Cited

UNITED STATES PATENTS

| | | | |
|---|---|---|---|
| 3,469,155 | 9/1969 | Van Beek | 317/235 |
| 3,470,390 | 9/1969 | Lin | 317/235 |
| 3,512,058 | 5/1970 | Khajezadeh | 317/235 |
| 3,543,052 | 11/1970 | Kahng | 317/235 |
| 3,648,129 | 3/1972 | Nienhuis | 317/235 |

OTHER PUBLICATIONS

Hot Carrier Diodes; By Soshea, Electronics July, 1963; pages 53 to 55

*Primary Examiner*—John S. Heyman
*Assistant Examiner*—Andrew J. James
*Attorney, Agent, or Firm*—Robert E. Burns; Emmanuel J. Lobato

[57] ABSTRACT

A field-effect transistor comprising a protective element constituted of two or more diodes connected in reversed relation, said protective element having such a structure that a region adjacent to another region at the same potential as a gate electrode has an impurity of higher concentration than that of at least one portion of region adjacent to said first region, or said protective element having at least one Schottky junction.

7 Claims, 7 Drawing Figures

HIGH FREQUENCY INSULATED GATE FIELD EFFECT TRANSISTOR WITH PROTECTIVE DIODES

This is a Continuation-in-Part of our application Ser. No. 24,167, filed Mar. 31, 1970 and now abandoned.

BACKGROUND OF THE INVENTION

This invention relates generally to field-effect transistors, and more particularly, to a field-effect transistor having protective diodes.

Insulated-gate field-effect transistors with their high input resistance have varieties of unique applications, but, once their gate insulator has broken down due to overvoltage, they are no longer serviceable because of the absence of such reversibility as is possessed by a p-n junction. A p-n junction diode is employed conventionally for the protection of the gate-insulating layer.

FIG. 1 illustrates both the insulated-gate field-effect transistor and the protective diode P. In this FIG. 1 the protective diode P is connected between the gate G of the field-effect transistor and a region (hereinafter referred to as a "base") where a channel is formed. However, the protective diode P used as in FIG. 1, in this case in conjunction with the insulated-gate field-effect transistor of an n-channel type, becomes unserviceable when (1) it is used in a field-effect transistor of the "depletion" type which remains operative even in the presence of a negative gate voltage, and (2) it is supplied with an input signal of such large amplitude that the input voltage will become negative. In the above instances, the protective diode is forward-biased, thereby permitting the flow of large current.

In order to prevent large current flow when the gate voltage become negative, back-to-back diodes, as shown in FIG. 2*a* and 2*b*, seem to be used as a gate protective element instead of a single diode as shown in FIG. 1.

The back-to-back diodes will serve as high impedance (i.e., good) gate protective element when a signal frequency is low, e.g., lower than that of radio frequency. For higher frequency application, the diodes must be made small and close enough to reduce the parasitic capacitance associated with the diodes. However, back-to-back diodes made close in a single semiconductor cristal is well known to operate as a bipolar transistor if the doping of the semiconductor regions, from which the diodes are made, is appropriate. This parasitic bipolar operation of the back-to-back diode disasterously lowers the impedance of the back-to-back diode. Thus, back-to-back diodes simply integrated in a single semiconductor crystal without considering the parasitic bipolar transistor operation can not be used as a protective element for high frequency application.

SUMMARY OF THE INVENTION

Therefore, it is an essential object of the invention to provide an integrated structure comprising an improved high frequency field-effect transistor in combination with protective diodes in which all deficiencies attendant to the prior protective diodes described above are overcome.

It is another object of the invention to provide an integrated structure comprising a high frequency field-effect transistor in combination with protective diodes that are suitable for a wide range of applications.

It is another object of the invention to provide an integrated structure comprising a high frequency field-effect transistor in combination with protective diodes which can be of use as to signals of both positive and negative polarities and the principles of which are applicable also in depletion type field-effect transistors.

Characteristic features and functions of the invention will be described in a more understandable manner in connection with the accompanying drawings, in which the same or equivalent members are indicated by the same numerals and characters.

DETAILED DESCRIPTION OF THE INVENTION

Figure 1:
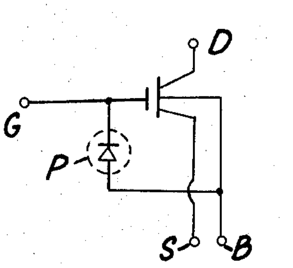
FIG. 1 is an equivalent circuit of a field-effect transistor having a protective diode as used conventionally.
Figure 2A:
FIG. 2 is a diagram of equivalent circuits of diodes in reversed connection.
Figure 2B:

Now, let it be assumed that protective diodes as arranged in FIG. 2 are combined in an integrated circuit with a high frequency field-effect transistor in which its channel length can be determined according to a difference in the diffusion lengths of two impurities. An example thereof is given in FIG. 3, wherein the reference numeral 200 designates a substrate of the same conductivity type as the base. Overlaid thereon is a uniformly thin semiconductor layer constituting regions 1 and 1P, etc., and having an opposite conductivity type to that of the substrate 200. Base regions 2*a* and source regions 3 are diffused selectively on this thin semiconductor layer by the use of one and the same diffusion mask. Regions 2*d* of the same conductivity type as the base diffused regions are diffused not so deep as to reach the substrate 200, unlike the base regions, and are provided to obtain a contact 2*c* with the base or to extinguish the channel.

Now, let it be assumed that a layer 5P for protective diodes is formed to be of doping higher than a region 1P by diffusion. A region 1P is isolated from other regions by the base region 2*a* and regions diffused simultaneously with region 2*a* and 2*d*, and thus a p-n-p or n-p-n structure is constituted of layer 5P, region 1P and substrate 200. This structure, used as the protective diodes of the arrangement of FIG. 2, may seem to work favorably with signals of both polarities. But it proves to be of no practical utility when it is taken into account that the diode constituted of regions 5P and 1P permite the flow of considerably large current with respect to a forward-biased input, with the region 5P working as emitter, the region 1P as base, and the substrate 200 as collector.

Figure 3:
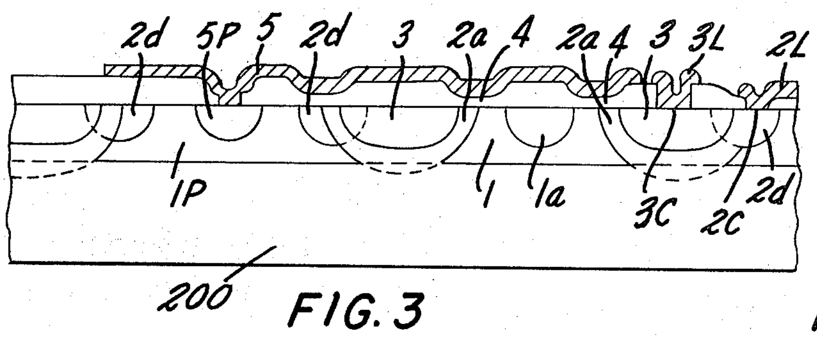
FIG. 3 is a fragmentary elevation section view of the protective element shown in FIG. 2, integrated by a ordinary skill in the same semiconductor crystal comprising a high frequency field-effect transistor.
Figure 4:
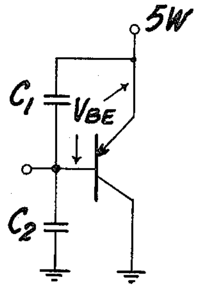
FIG. 4 is an equivalent circuit of the parasitic bipolar transistor and parasitic capacitors associated with the protective element shown in FIG. 3.

For instance, if the region 5P is of P+ type, an equivalent circuit of the back-to-back diodes comprising the region 5P, 1P and the substrate 200 becomes a p-n-p transistor with the base open as shown in FIG. 4. In the figure, $C_1$ and $C_2$ represent the junction capacitance between the region 5P and 1P, and between the region 1P and the substrate 200, respectively. The terminal 5W corresponds to metal layer 5 in FIG. 3 to which a DC bias and high frequency signal is applied.

When the voltage at terminal 5W is positive, the base-emitter junction is forward biased and the base emitter voltage $V_{BE}$ remains almost constant for a large signal. So the signal voltage V appears across the base collector (i.e., the region 1P and the substrate) junction, resulting the base current of $j\omega C_2$. $\omega$ denotes the angular frequency of the high frequency signal. This base current induce the emitter current $j\omega C_2(1+\beta)$.

The above discussion means that $C_2$ is multiplied by $\beta$ which is the current amplification factor of the parasitic bipolar transistor. At the frequency higher than $f_T$ of the parasitic bipolar transistor, the impedance seen from terminal 5W becomes lossy.

Thus the parasitic capacitance can not be reduced and even a loss factor appears at a higher frequency, if the back-to-back diodes are inadequately designed in the doping relation of the each region in the crystal.

Figure 5:
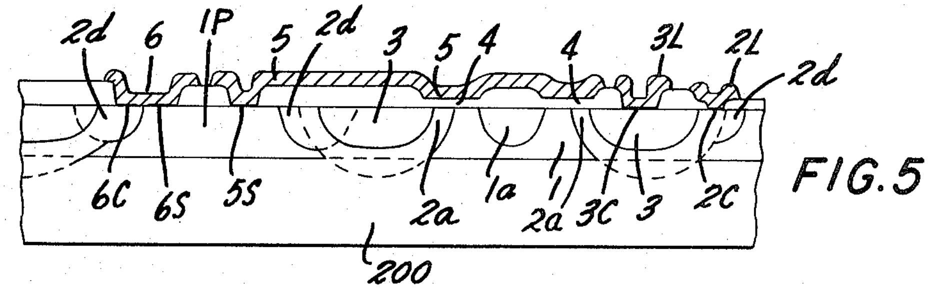
FIG. 5, 6 and 7 are fragmentary elevation section views of embodiments of the present invention.

This difficulty, however, is avoidable either (1) by making the impurity concentration of the region 5P less than that of the region 1P by the refilling technique of epitaxial growth or a buried layer technique and the like, or (2) by providing a Schottky junction 5S on the region 1P instead of the region 5P as illustrated in FIG. 5. In this manner, there will be no minority carriers injected from the region 5P, and, therefore, no large current flows between the substrate 200 and the region 5P. Further, with the Schottky junction provided as in FIG. 4, there is also no large current flow between the gate 5 and the substrate 200 due to the absence of any minority carriers injected thereto.

The above discussion is only for such a polarity of input voltage that the junction between region 5P and 1P is forward biased. In FIG. 5, another Schottky barrier 6S is added by a metal layer 6 in parallel with the pn junction comprising the region *2d* and 1P to prevent the minority carrier injection into the region 1P from the region *2d*. This minority carrier injection will occur when the polarity of the input signal is reversed, unless Schottky barrier 6S whose turn-on voltage is less than that of p n junction is applied. In FIG. 5, the metal layer 6 has an ohmic contact 6C with the diffused region 2d with high surface impurity concentration.

FIGS. 3 and 5, the reference numeral 1 designates a drain region with low impurity concentration, 1a a drain region with high impurity concentration, 2L a base-connector electrode, 3C a source contact, 3L a source-connector electrode, and 4 a gate insulator.

Figure 6:
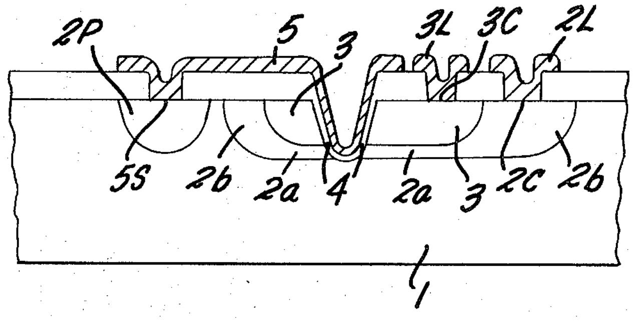

The invention has been described in the foregoing with reference to the embodiments thereof shown in FIG. 5. Still another embodiment of the invention is illustrated in FIG. 6, wherein the field-effect transistor has its region *2a*, in which a channel is to be formed, exposed on the semiconductor surface by the removal of part of a double-diffused region. Throughout FIGS. 3, 5, 6 and 7, like reference numerals represent like portions of the field-effect transistors illustrated therein. A region 2P, also in FIG. 5, may be diffused either simultaneously with the external base region *2b* or, if it has an opposite conductivity type to that of a drain region 1, and is diffused separately so as to have such a low concentration of impurities that a Schottky junction is formed on the surface thereof. And in this case, the Schottky junction 5S, region 2P and drain region 1 constitute two diodes in reversed connection.

The Schottky junction does not inject minority carrier and minority carriers injected into the region 2P from the region 1 is negligiblly small, because the diffused region 2P is higher in the concentration than the region 1. The possible "transistor action" due to injected minority carriers into the region 2P is practically negligible.

Figure 7:
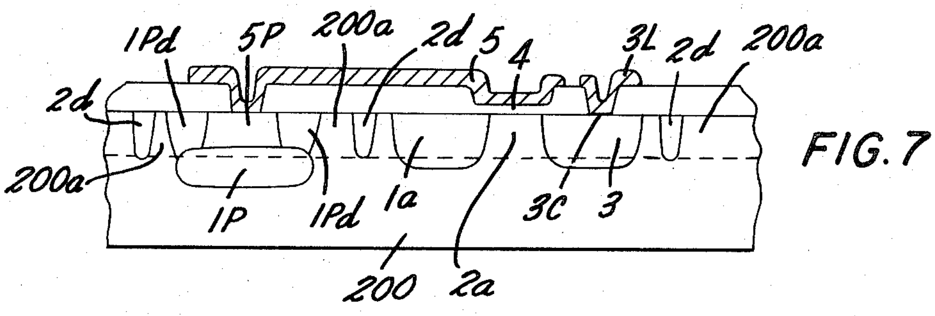

Generally speaking, the number of minority carriers injected into the region of floating potential, which is one of regions constituting the back-to-back diodes, must be kept as small as possible to prevent the parasitic bipolar transistor action. When the back-to-back diodes are made by two pn junction diode, this principle results the following doping relation between respective regions; the region of floating potential must be higherst in impurity concentration than the other adjacent region at the junction. This doping relation can be easily obtained by using buried layer technique and ordinary selective diffusion technique as shown in FIG. 7. The process to get a device shown in FIG. 7 is briefly described as follows;

1. Region 1P is made into the substrate 200 by selective diffusion. The region 1P is higher in impurity concentration than the substrate 200 and of the conductivity opposite to the substrate.

2. A thin layer 200 a is grown on the entire surface of the substrate. The layer 200 a is of the same conductivity type as the substrate and lower in impurity concentration than the region 1P.

3. Channel cut regions *2d* which are of the same conductivity type as the layer *200a* are selectively diffused.

4. The source region 3, drain region *1a*, and regions **1P*d* are simultaneously diffused deeper than the thickness of the layer *200a*. Thus regions 1P*d* become continuous to the region 1P resulting the isolatation of the region 5P from the remainder of the layer *200a* and the substrate. The regions 3, *1a* and 1P*d*** are of the conductivity type opposite to the substrate.

5. The gate insulator 4 is grown, contact holes are open and metalizing is performed. The metal layer 5 is the gate electrode on the gate insulator 4 and also connecting layer between the gate electrode and the protective diodes.

The protective back-to-back diodes shown in FIG. 7 shows excellent high frequency characteristics, because they comprises substrate 200 (and layer *200a*), regions 1P and **1P*d*, and region 5P, and the regions 1P and 1P*d*** of floating potential is the highest in impurity concentration among the regions which constitute the back-to-back diodes. Thus the parasitic bipolar transistor action can be made practically negligible.

We claim:

1. A high frequency insulated gate field-effect transistor comprising an integrated semiconductor crystal having a substrate of first conductivity type, a uniformly thin semiconductor layer of a second conductivity type overlying said substrate and higher in impurity concentration than said substrate, a base region of said first conductivity type integrated into said semiconductor layer to a depth sufficient to electrically connect it to said substrate, a source region of said second conductivity type integrated into said base region, a gate insulator overlying said semiconductor layer, a gate electrode overlying said gate insulator, a drain region of said second conductivity type integrated into said semiconductor layer, and a protective element for protection against the breakdown of said insulator, said protective element being integrated in the same semiconductor crystal in which said field-effect transistor is integrated comprising two reverse connected p-n junctions, said two p-n junctions comprising three semiconductor regions one of which is disposed between the other two regions is different in conductivity type from said other two regions and higher in impurity concentration than the other two regions at said junctions thereby suppressing minority carrier injection, one of said two regions being of said first conductivity type and integrated into said semiconductor layer and being electrically connected to said gate electrode, and the other of said two regions being electrically connected to said source, said semiconductor layer being said region of higher impurity concentration between said two regions of said protective element.

2. A high frequency insulated gate field - effect transistor comprising an integrated semiconductor crystal having a substrate of first conductivity type, a uniformly thin semiconductor layer of a second conductivity type overlying said substrate and higher in impurity concentration than said substrate, a base region of said first conductivity type integrated into said semiconductor layer to a depth sufficient to electrically connect it to said substrate, a source region of said second conductivity type integrated into said base region, a gate insulator overlying said semiconductor layer, a gate electrode overlying said gate insulator, a drain region of said second conductivity type integrated into said semiconductor layer, and a protective element for protection against the breakdown of said gate insulator, said protective element being integrated in the same semiconductor crystal in which said field-effect transistor is integrated, comprising two reverse connected p-n junctions, said two p-n junctions comprising three semiconductor regions one of which is disposed between the other two regions is different in conductivity type from the other two regions and higher in impurity concentration than said other two regions at said junctions thereby suppressing minority carrier injection, one of said two regions being electrically connected to said gate electrode and the other of said two regions being electrically connected to the same semiconductor substrate as that of said field effect transistor, said semiconductor layer being said region of higher impurity concentration between said two regions of said protective element.

3. A high frequency insulated gate field-effect transistor comprising in integrated semiconductor crystal having a substrate of first conductivity type, a uniformly thin semiconductor layer of a second conductivity type overlying said substrate and higher in impurity concentration than said substrate, a base region of said first conductivity type integrated into said semiconductor layer to a depth sufficient to electrically connect it to said substrate, a source region of said second conductivity type integrated into said base region, a gate insulator overlying said semiconductor layer, a gate electrode overlying said gate insulator, a drain region of said second conductivity type integrated into said semiconductor layer, and a protective element for protection against the breakdown of said gate insulator, said protective element being integrated in the same semiconductor crystal in which said field-effect transistor is integrated comprising two reverse connected p-n junctions, said two p-n junctions comprising three semiconductor regions one of which is disposed between the other two regions is different in conductivity type from said other two regions is higher in impurity concentration than the other two regions at said junctions thereby suppressing minority carrier injection, one of said two regions being electrically connected to said gate electrode and the other of said two regions being said semiconductor substrate itself, said semiconductor layer being said region of higher impurity concentration between said two regions of said protective element.

4. A high frequency insulated gate field-effect transistor comprising a substrate of first conductivity type, a uniformly thin semiconductor layer of a second conductivity type overlying said substrate and higher in impurity concentration than said substrate, a base region of said first conductivity type integrated into said semiconductor layer to a depth sufficient to electrically connect it to said substrate, a source region of said second conductivity type integrated into said base region, a gate insulator overlying said semiconductor layer, a gate electrode overlying said gate insulator, a drain region of said second conductivity type integrated into said semiconductor layer, and a protective element for protection against the breakdown of said gate insulator, said protective element being integrated in the same semiconductor crystal comprising said field-effect transistor and comprising a reverse connected p-n junction and a Schottky junction thereby suppressing minority carrier injection, said p-n junction comprising at least two semiconductor regions I, II different in conductivity type and impurity concentration, said Schottky junction being formed on said semiconductor region I forming a p-n junction, said region I having higher impurity concentration at said p-n junction than another said region II forming said p-n junction, said Schottky junction and said p-n junction thereby establish means effective to suppress minority carrier injection, one of the materials forming said Schottky junction and the said region II forming said p-n junction being electrically connected to said gate electrode, the remainder being electrically connected to said substrate of said field-effect transistor.

5. A high frequency insulated gate field-effect transistor comprising a substrate of a first conductivity type, a uniformly thin semiconductor layer of a second conductivity type overlying said substrate and higher in impurity concentration than said substrate, a base region of said first conductivity type integrated into said semiconductor layer to a depth sufficient to electrically connect it to said substrate, a source region of said second conductivity type integrated into said base region, a gate insulator overlying said semiconductor layer, a gate electrode overlying said gate insulator, a drain region of said second conductivity type integrated into said semiconductor layer, and a protective element for protection against the breakdown of said gate insulator, said protective element being integrated in the same semiconductor crystal comprising said field-effect transistor and comprising a reverse connected p-n junction and a Schottky junction, said p-n junction comprising at least two semiconductor regions I, II different in conductivity type and impurity concentration, said Schottky junction being formed on said semiconductor region I forming a p-n junction, said region I having higher impurity concentration at said p-n junction than said region II forming said p-n junction, said Schottky junction and said p-n junction thereby establish means effective to suppress minority carrier injection, one of the materials forming said Schottky junction and the said region II forming said p-n junction being electrically connected to said gate electrode, the remainder being electrically connected to said source.

6. A high frequency insulated gate field-effect transistor comprising a substrate of a first conductivity type, a uniformly thin semiconductor layer of a second conductivity type overlying said substrate and higher in impurity concentration than said substrate, a base region of said first conductivity type integrated into said semiconductor layer to a depth sufficient to electrically connect it to said substrate, a source region of said second conductivity type integrated into said base region, a gate insulator overlying said semiconductor layer, a gate electrode overlying said gate insulator, a drain region of said second conductivity type integrated into said semiconductor layer, and a protective element for protection against the breakdown of said gate insulator, said protective element being integrated in the same semiconductor crystal comprising said field-effect transistor and comprising a reverse connected p-n junction and a Schottky junction, said p-n junction comprising at least two semiconductor regions I,II different in conductivity type and impurity concentration, said Schottky junction being formed on said semiconductor region I forming a p-n junction, said region I higher in impurity concentration at said p-n junction than another said region II forming said p-n junction, said Schottky junction and said p-n junction thereby establish means effective to suppress minority carrier injection, one of the materials forming said Schottky junction and the said region II forming said p-n junction being electrically connected to said gate electrode, the remainder being said semiconductor substrate.

7. A high frequency insulated gate field-effect transistor comprising a substrate of a first conductivity type, a uniformly thin semiconductor layer of a second conductivity type overlying said substrate and higher in impurity concentration than said substrate, a base region of said first conductivity type integrated into said semiconductor layer to a depth sufficient to electrically connect it to said substrate, a source region of said second conductivity type integrated into said base region, a gate insulator overlying said semiconductor layer, a gate electrode overlying said gate insulator, a drain region of said second conductivity type integrated into said semiconductor layer, and protective element for protection against the breakdown of said gate insulator, said protective element being integrated in the same semiconductor crystal comprising said field-effect transistor and comprising reverse connected two Schottky junctions, said Schottky junctions comprising two separate metal layers on a semiconductor region which is isolated from said substrate and establishing means effective to suppress minority carrier injection, one of said metal layers being electrically connected to said gate electrode, the remainder being electrically connected to said substrate or said source.

* * * * *